(12) United States Patent
Manole

(10) Patent No.: US 7,401,472 B2
(45) Date of Patent: Jul. 22, 2008

(54) MODULAR HEATING OR COOLING SYSTEM

(75) Inventor: Dan M Manole, Tecumseh, MI (US)

(73) Assignee: Tecumseh Products Company, Tecumseh, MI (US)

( * ) Notice: Subject to any disclaimer, the term of this patent is extended or adjusted under 35 U.S.C. 154(b) by 549 days.

(21) Appl. No.: 10/750,693

(22) Filed: Jan. 2, 2004

(65) Prior Publication Data

US 2004/0139760 A1 Jul. 22, 2004

Related U.S. Application Data

(60) Provisional application No. 60/440,764, filed on Jan. 17, 2003.

(51) Int. Cl.
*F25D 23/12* (2006.01)
*F28D 15/00* (2006.01)
*H05K 7/20* (2006.01)

(52) U.S. Cl. .................. 62/259.2; 165/104.33; 361/688

(58) Field of Classification Search ................ 62/259.2, 62/298, 448; 165/104.33; 361/687, 688, 361/697, 698
See application file for complete search history.

(56) References Cited

U.S. PATENT DOCUMENTS

| | | | |
|---|---|---|---|
| 3,074,244 A | 1/1963 | Malaker et al. | |
| 3,736,761 A | 6/1973 | Richmond et al. | |
| 3,991,585 A | 11/1976 | Mulder | |
| 4,392,362 A | 7/1983 | Little | |
| 4,489,570 A | 12/1984 | Little | |
| 4,928,502 A | 5/1990 | Kumada et al. | |
| 4,979,368 A | 12/1990 | Stetson | |
| 5,111,665 A | 5/1992 | Ackermann | |
| 5,165,243 A | 11/1992 | Bennett | |
| 5,303,555 A | 4/1994 | Chrysler et al. | |
| 5,323,293 A | 6/1994 | Angiulli et al. | |
| 5,349,823 A | 9/1994 | Solomon | |
| 5,457,956 A | 10/1995 | Bowman et al. | |
| 5,491,980 A | 2/1996 | Yingst et al. | |
| 5,673,561 A | 10/1997 | Moss | |
| 5,711,156 A | 1/1998 | Matsui et al. | |
| 5,794,450 A | 8/1998 | Alexander | |
| 5,839,295 A * | 11/1998 | Lehmann ..................... 62/498 |
| 5,862,038 A | 1/1999 | Suzuki et al. | |
| 5,896,922 A | 4/1999 | Chrysler et al. | |
| 5,934,364 A | 8/1999 | Chrysler et al. | |
| 6,034,872 A | 3/2000 | Chrysler et al. | |
| 6,035,655 A | 3/2000 | Hare et al. | |

(Continued)

*Primary Examiner*—Chen-Wen Jiang
(74) *Attorney, Agent, or Firm*—Baker & Daniels LLP

(57) ABSTRACT

A refrigeration system module including a frame, a heating plate having a fluid inlet and a fluid outlet and a first heat transfer surface, a cooling plate having a fluid inlet and a fluid outlet and a second heat transfer surface, an expansion device disposed between the heating and cooling plates and in fluid communication with the heating plate fluid outlet and the cooling plate fluid inlet, and a hermetic compressor assembly. The compressor assembly is disposed between the heating and cooling plates and has a discharge outlet in fluid communication with the heating plate inlet, and a suction inlet in fluid communication with the cooling plate fluid outlet. The heating plate, the cooling plate, the expansion device and the compressor are fixed to the frame, and the first and second heat transfer surfaces each at least partially define an exterior surface of the module.

20 Claims, 3 Drawing Sheets

U.S. PATENT DOCUMENTS

| | | |
|---|---|---|
| 6,148,635 A | 11/2000 | Beebe et al. |
| 6,205,791 B1 | 3/2001 | Smith, Jr. |
| 6,205,803 B1 | 3/2001 | Scaringe |
| 6,209,328 B1 | 4/2001 | Kim et al. |
| 6,216,467 B1 | 4/2001 | O'Neil et al. |
| 6,236,566 B1 | 5/2001 | Regnier et al. |
| 6,256,999 B1 | 7/2001 | Chase |
| 6,266,963 B1 | 7/2001 | Rudick |
| 6,272,866 B1 | 8/2001 | Tsai et al. |
| 6,272,867 B1 | 8/2001 | Barrash et al. |
| 6,345,512 B1 | 2/2002 | Cosley et al. |
| 6,366,462 B1 | 4/2002 | Chu et al. |
| 6,393,853 B1 * | 5/2002 | Vukovic et al. ............ 62/259.2 |
| 6,397,618 B1 | 6/2002 | Chu et al. |
| 6,437,979 B1 | 8/2002 | Unrein |
| 6,438,984 B1 | 8/2002 | Novotny et al. |
| 6,493,223 B1 * | 12/2002 | Viswanath et al. .......... 361/690 |
| 6,519,955 B2 | 2/2003 | Marsala |
| 6,533,031 B1 | 3/2003 | Garcia et al. |
| 6,567,269 B2 | 5/2003 | Homer et al. |
| 6,687,122 B2 * | 2/2004 | Monfarad ................... 361/687 |
| 6,729,383 B1 * | 5/2004 | Cannell et al. ............. 165/80.3 |
| 6,796,372 B2 * | 9/2004 | Bear ..................... 165/104.21 |
| 2003/0043542 A1 | 3/2003 | Monfarad |
| 2003/0070789 A1 | 4/2003 | Mueller et al. |
| 2003/0070799 A1 | 4/2003 | Mueller et al. |

\* cited by examiner

MODULAR HEATING OR COOLING SYSTEM

REFERENCE TO RELATED APPLICATIONS

The present application claims priority under 35 U.S.C. 119(e) to now abandoned Provisional Application, Ser. No. 60/440,764, filed on Jan. 17, 2003 entitled MODULAR HEATING OR COOLING SYSTEM the disclosure of which is hereby incorporated herein by reference.

BACKGROUND OF THE INVENTION

The present invention pertains to heating and cooling systems, particularly those for controlling the temperature of fluids, components or items within an enclosure.

Some enclosures contain components or items which are to be heated or cooled. These enclosures may include cabinets housing computers or other electronic devices, vending machines containing food or beverages, coolers, warmers, and other applications. In some first application types, a fluid medium in the enclosure, such as air or water, may first be cooled or warmed, with convective heat transfer secondarily occurring between the item or component and the medium. Additionally, these applications may relate to providing a product which involves temperature-treating a fluid, such as an ice machine. Examples of this application type are very well known, and include, in addition to ice machines, refrigerators, immersion baths, vending machines, and other applications.

In other, second application types, the item or component may be directly cooled or heated via conductive contact with a heatsink or a source of heat. As an example of this application type, it is sometimes necessary to provide cooling to microprocessors or breadboards within a computer cabinet beyond what can be accomplished via forced air convection. Typically, such cooling is performed by placing the component in conductive communication with the heat transfer surface of a cold plate, which serves as a heatsink.

Cold plates are well-known heat exchangers, are readily commercially available, and are usually constructed of a metal, such as an aluminum or copper alloy, having good conductive properties. Cold plates are typically metal machinings, castings or weldments providing a heat transfer surface, and which are provided with conduits located beneath the heat transfer surface and formed of series of passages or baffles, or a tubular coil through which a working fluid is flowed. The working fluid is introduced into the interior of the cold plate through an inlet, and directed through the conduit to a cold plate outlet. Heat is transferred conductively to or from the heat transfer surface to the conduit, and convectively between the conduit and the working fluid. The heat transfer surface may be small or quite large, depending on the needs of the particular application, such as, for example, the number of components to be conductively cooled.

Thus, in cooling, heat is transferred from what is being cooled to the plate's heat transfer surface, then conductively to the conduit wall, and then convectively to a cooling working fluid. The warmed fluid then exits the cold plate through the outlet and is expelled to ambient, or is cooled before being recirculated through the cold plate. Similarly, in heating, heat is transferred from a warming working fluid convectively to the conduit, then conductively to the heat transfer surface, and then to what is being warmed. Liberated of the transferred heat, the cooled working fluid exits the plate through its outlet and is dumped to ambient, or is reheated before recirculation through the cold plate. Herein, the term "cold plate" is used for this type of heat exchanger regardless of the direction of heat transfer between the working fluid and the heat transfer surface.

Cold plates may also be used for heating or cooling in applications of the above-mentioned first type, wherein heat is transferred between the cold plate's heat transfer surface and the convective fluid medium, which in turn heats or cools items or components surrounded by the medium. In such applications, air or water, for example, may be placed in convective contact with the exterior of the cold plate's heat transfer surface or another convective heat exchange arrangement, such as a plurality of fins, placed in conductive contact with the cold plate's heat transfer surface.

The applications for cooling or heating with cold plates vary greatly, and the manufacturers of the component or enclosure to be heated or cooled often lack the expertise, facilities or willingness to design, assemble or otherwise provide cooling or heating componentry, much less systems including same. Therefore, these manufacturers typically look to vendors for supplying the necessary components or heating/cooling systems or subsystems. Normally, the cold plate is provided as a component separately from other heating or cooling components, and the manufacturers or their customers undertake assembly of the heating/cooling system or subsystem.

Regardless of the application, a complete, modular system by which heating or cooling of an enclosure, or items or components therein, may be easily provided is greatly desirable. Such a system would simplify design and assembly for the above-mentioned manufacturers and/or their customers, and improve the reliability of the system, for no fluid joints to or from the heating/cooling system, or any other assembly of the system itself, need be made thereby.

Further, it would be desirable to provide a common heating/cooling system by which either heating or cooling can be performed with the same module. Such a module would reduce complexity and inventory, and their attendant costs, and simplify assembly and repair procedures.

Further still, despite any such standardization of such modules, it would be desirable in some instances to conveniently increase the heating or cooling capacity of an enclosure utilizing such modular systems.

Moreover, a means for quickly replacing a heating or cooling system without special tools, disconnecting and connecting fluid joints, or undertaking working fluid charge procedures, in the event of system failure or as part of routine maintenance, would also be desirable.

SUMMARY OF THE INVENTION

These desires are fulfilled by the present invention, which provides a modular, complete system for either heating or cooling, which can be easily adapted to a variety of applications of both the above-mentioned first and second types, and which may be easily increased in capacity.

The present invention provides a modular heating or cooling system or refrigeration system module which may singularly, or in combination with other such modules connected in series or in parallel, provide heating and/or cooling to a fluid medium, or items or components within enclosure to which the module is attached. Each inventive module may be powered or replaced independently of any other ones of the inventive modules, and in itself provides a complete, self-contained refrigeration system unit by which heating or cooling may be effected. A module according to the present invention has a pair of cold plates each having heat transfer surfaces, one through which heat is transferred to the module's refrigeration system, the other through which heat is transferred from the module's refrigeration system.

The invention comprises, in one form thereof, a refrigeration system module for heating or cooling an object wherein the module includes an enclosure having a refrigeration system disposed therein. The refrigeration system includes a vapor compression circuit for circulating a refrigerant and has a compressor, a first heat exchanger, an expansion device and a second heat exchanger operably disposed therein in serial order. The first heat exchanger defines a first outward facing surface of the enclosure. The first surface is a thermal exchange surface wherein the first heat exchanger provides thermal communication between the first surface and refrigerant flowing within the first heat exchanger. The second heat exchanger defines a second outward facing surface of the enclosure. The second surface is a thermal exchange surface wherein the second heat exchanger provides thermal communication between the second surface and refrigerant flowing within the second heat exchanger. The first and second surfaces are disposed on opposite sides of said enclosure and the module also includes at least one attachment feature disposed on the module wherein the at least one attachment feature is attachable to the object, e.g., a computer cabinet or another refrigeration system module, to thereby secure the object in thermal communication with at least one of the first and second surfaces. The at least one attachment feature may take the form of an aperture disposed proximate each of the first and second surfaces whereby a fastener can be inserted through each of the apertures.

The invention comprises, in another form thereof, a modular refrigeration system that includes a plurality of refrigeration system modules. Each of the modules includes an enclosure having a refrigeration system disposed therein where the refrigeration system includes a vapor compression circuit for circulating a refrigerant and having a compressor, a first heat exchanger, an expansion device and a second heat exchanger operably disposed therein in serial order. The first heat exchanger defines a first outward facing surface of the enclosure. The first surface being a thermal exchange surface wherein the first heat exchanger provides thermal communication between the first surface and refrigerant flowing within the first heat exchanger. The second heat exchanger defines a second outward facing surface of the enclosure. The second surface being a thermal exchange surface wherein the second heat exchanger provides thermal communication between the second surface and refrigerant flowing within the second heat exchanger. The first and second surfaces are disposed on opposite sides of the enclosure and at least one attachment feature is disposed on the module wherein the at least one attachment feature is attachable to another one of the modules to thereby secure the first surface of one of the plurality of modules in thermal communication with the second surface of another one of the plurality of modules. For some embodiments, the compressor may be a hermetically sealed compressor mounted within the enclosure with the enclosure providing communication between the interior of the enclosure and the ambient environment. The first and second surfaces of each of the modules may have substantially similar surface areas to thereby facilitate the engagement and transfer of thermal energy between first and second surfaces of modules that are secured together.

Certain embodiments of the present invention provide a refrigeration system module including a frame, a heating plate having a fluid inlet and a fluid outlet and a first heat transfer surface, a cooling plate having a fluid inlet and a fluid outlet and a second heat transfer surface, an expansion device disposed between the heating and cooling plates and in fluid communication with the heating plate fluid outlet and the cooling plate fluid inlet, and a hermetic compressor assembly. The compressor assembly is disposed between the heating and cooling plates and has a discharge outlet in fluid communication with the heating plate fluid inlet, and a suction inlet in fluid communication with the cooling plate fluid outlet. The heating plate, the cooling plate, the expansion device and the compressor are fixed to the frame, and the first and second heat transfer surfaces each at least partially define an exterior surface of the module.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Figure 1:
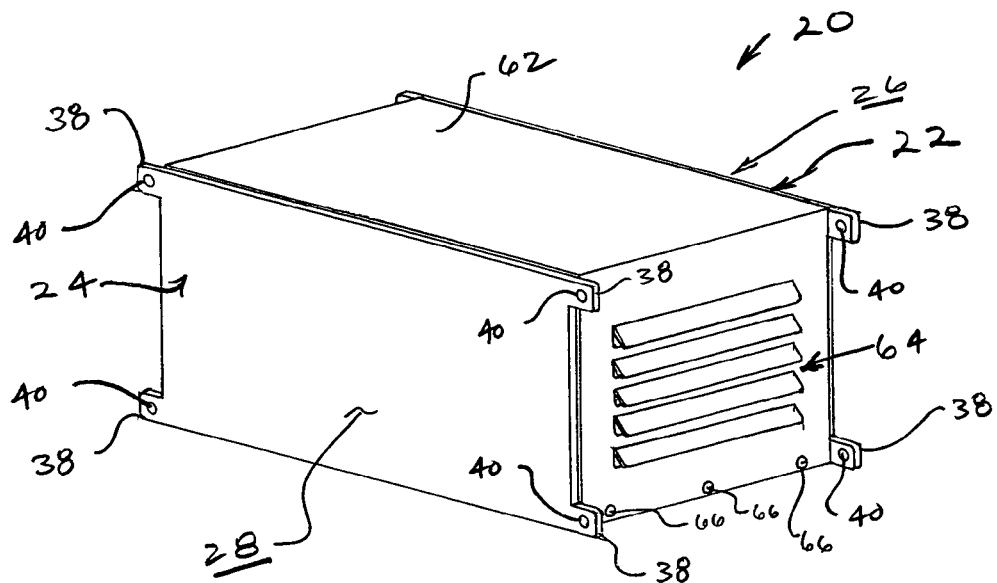
FIG. 1 is a perspective view of a first embodiment of a refrigeration system module according to the present invention.

Corresponding reference characters indicate corresponding parts throughout the several views. Although the drawings represent an embodiment of the present invention, the drawings are not necessarily to scale and certain features may be exaggerated in order to better illustrate and explain the present invention. The exemplification set out herein illustrates an embodiment of the invention, in one form, and such exemplification is not to be construed as limiting the scope of the invention in any manner.

DETAILED DESCRIPTION OF THE INVENTION

An embodiment of the inventive modular cooling or heating system or is shown in FIG. 1. Refrigeration system module 20 has the form of a parallelepiped having six sides of rectangular shape, and may be of any convenient size which can accommodate its interior components and provide the desired heat transfer capacity. It is envisioned that module 20 may be a singular product offering, but offerings of similar modules of different sizes may be made as warranted by various applications having substantially-different cooling requirements which cannot be accommodated by a plurality of modules 20.

Figure 2:
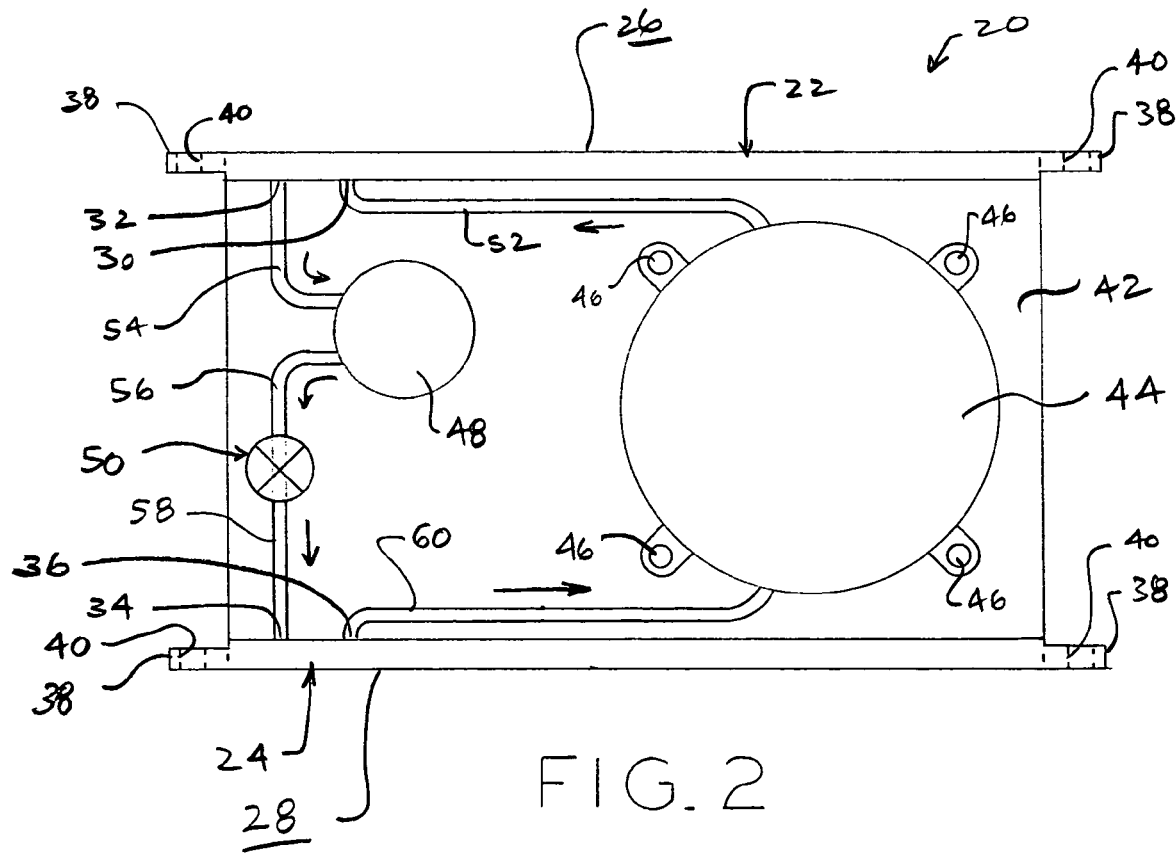
FIG. 2 is a top plan view of the module of FIG. 1 with its shroud removed to display interior componentry.

Module 20 provides a complete refrigeration system by which heating or cooling of an entity including a gas, liquid, and/or solid may be accomplished. Exemplary module 20 includes cold plates 22 and 24, for the purposes of discussion respectively referred to herein as heating plate 22 and cooling plate 24. Plates 22 and 24 function as first and second heat exchangers and are located on opposite sides of module 20 and are of any suitable construction known in the art. Heating plate 22 is provided with exteriorly-facing heat transfer surface 26 and cooling plate 24 is provided with exteriorly-facing heat transfer surface 28. Surfaces 26 and 28 define opposite, exterior side surfaces of module 20. As described below, heat is transferred from and to heat exchange surfaces 26 and 28, respectively with the body of plates 22, 24 providing thermal communication between the working fluid flowing within the plates and the heat exchange surfaces. Heating plate 22 is provided with working fluid inlet 30 and working fluid outlet 32 as shown in FIG. 2. Heating plate 22 is provided with internal conduits (not shown) as described above, through which the working fluid passes between the inlet and outlet. Cooling plate 24 is provided with inlet 34 and outlet 36 through which the working fluid flows to and from plate 24, and may be of construction identical to heating plate 22. Plates 22 and 24 may be cast, machined or welded from any suitable material, such as a copper or aluminum alloy, for example, as well known in the art. The working fluid used in module 20 is a refrigerant of any suitable type, such as, for example, R22, R410a, or R290. With appropriate provisions to accommodate extremely high pressures, module 20 may also utilize carbon dioxide as the working fluid.

The peripheral edges of plates 22 and 24 are provided with attachment features disposed proximate their outwardly facing heat transfer surfaces and which, in the illustrated embodiment, take the form of tabs 38 which extend laterally outwardly, each tab 38 being provided with a bolt clearance hole 40. The exposed faces and tabs of plates 22 and 24 are identical or mirror-imaged such that, were the plates interfaced, their heat transfer surfaces would abut each over their entire respective areas, which are matched in size, and each pair of adjacent holes 40 would be aligned. As described below, a plurality of modules 20 may be connected in series to increase the cooling capacity of the overall heating/cooling system, the interfacing heat transfer surfaces of adjacent modules 20 being in conductive communication.

Module 20 has a frame to which its components are fixed together, the frame including stamped steel base plate 42 (FIG. 2) located between plates 22 and 24, and to which these plates are rigidly attached. Also disposed between plates 22 and 24 is hermetic refrigerant compressor 44, which is affixed to base plate 42 by means of bolts 46. Compressor assembly 44 may be of any suitable design known in the art and may be of any type, such as, for example, rotary, reciprocating piston or scroll. The structure and operation of hermetic compressors is well-known in the art, and therefore not described in detail herein. Those of ordinary skill in the art recognized hermetic compressors as having a sealed housing within which is disposed an electric motor and a compression mechanism, the motor driving the compression mechanism. A refrigerant is received into the compression mechanism at low, substantially suction pressure, and is compressed by the compression mechanism to high, substantially discharge pressure, at which pressure it exits the compressor assembly. The general structures and operations of rotary, reciprocating piston and scroll compressor assemblies are respectively described in U.S. Pat. Nos. 5,222,885, 5,266,016 and 5,306, 126, each of which is assigned to Tecumseh Products Company, the disclosures of which are all expressly incorporated herein by reference.

Refrigerant receiver 48 and expansion device 50 are also disposed between plates 22 and 24 and fixed to base plate 42. Expansion device 50 may be of fixed orifice or thermal expansion valve type, both well known in the art, and provides a pressure drop in the liquid refrigerant flowing therethrough prior to the working fluid reaching cooling plate 24.

As indicated by the flowpath arrows shown in FIG. 2, refrigerant at discharge pressure exits compressor 44 through discharge tube 52, and is directed thereby to inlet 30 of heating plate 22. The discharge pressure gas is therein reduced in temperature as heat is transferred from surface 26, and is converted to a high pressure liquid state. The high pressure liquid exits heating plate 22 through its outlet 32 and is conveyed through high pressure liquid tube 54 to receiver 48, wherein a portion of the refrigerant may be stored, as is typical of ordinary refrigeration systems. High pressure liquid refrigerant flows from receiver 48 through high pressure liquid tube 56 to expansion device 50.

As the liquid working fluid flows through expansion device 50, it is reduced in pressure and temperature, and directed through low pressure liquid tube 58 to inlet 34 of cooling plate 24. Heat transferred to surface 28 is absorbed by the low pressure working fluid within cooling plate 24, and the low pressure liquid working fluid is evaporated therein to a low pressure gas substantially at suction pressure. Gas at suction pressure exits plate 24 through outlet 36 and is drawn through suction tube 60 to the inlet of compressor 44. Those of ordinary skill in the art will recognize that the above-described refrigerant system may be modified to provide an accumulator in series between cooling plate 24 and compressor 44 in lieu of providing receiver 48.

Further, those of ordinary skill in the art will recognize that the above-described refrigerant system may be modified to a heat pump configuration having a reversing valve and associated lines (not shown) such that fluid at discharge pressure may be directed from compressor 44 to either one of cold plates 22 and 24 while suction pressure gas is provided to the other cold plate, whereby they would each alternatingly serve as cooling and heating plates. Notably, however, incorporating such complexity into module 20 should not be necessary in most applications, wherein only heating or cooling is the objective, for the inventive module can accomplish either cooling or heating functions by simply reversing its orientation relative to the enclosure, as described further below.

Shroud 62, which defines three of the six sides of module 20, encloses the interior components of module 20. Shroud 62 is a stamped sheetmetal or formed plastic piece having a generally U-shaped section having a central portion defining the top of module 20 which is located between two downwardly extending legs in which are provided louvers 64. The free ends of the shroud legs are attached to base plate 42 with screws 66. A cooling fan (not shown) may also be attached to base plate 42 to facilitate forced convection through module 20, with cooling air being drawn into the interior of module 20 through louvers 64 formed in one shroud leg, and forced from the interior of module 20 through louvers 64 formed in the other shroud leg.

Figure 3:
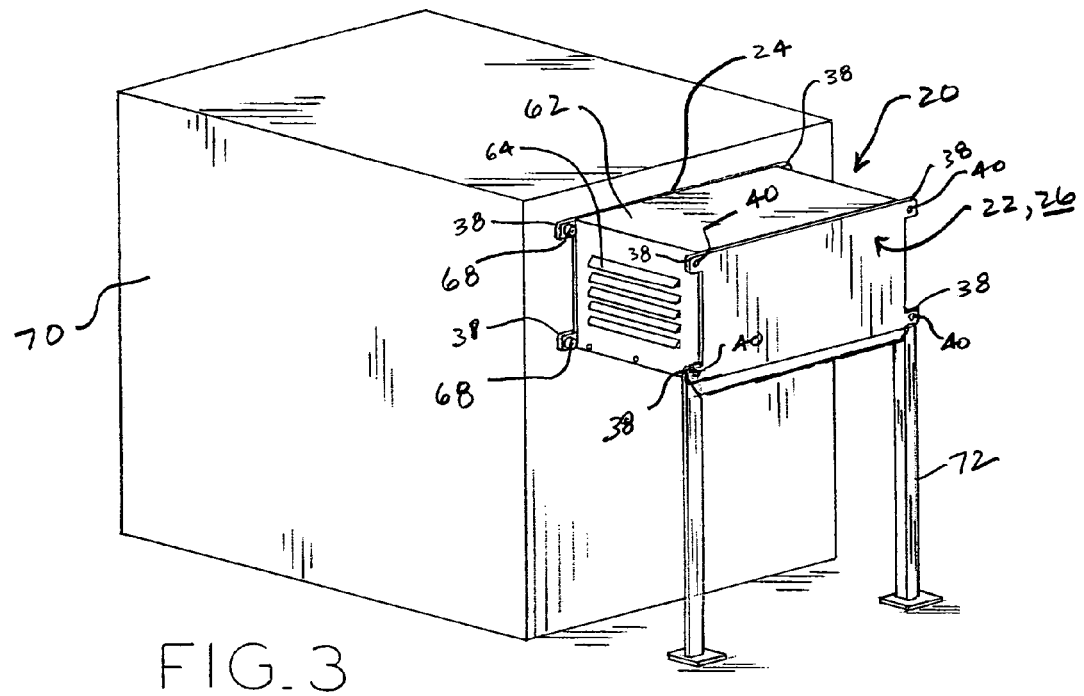
FIG. 3 is a perspective view of a cabinet having the module of FIG. 1 attached thereto for providing cooling or heating of the cabinet interior or componentry located inside the cabinet.

Referring now to FIG. 3, bolts 68 extending through bolt holes 40 in tabs 38 of one of cold plates 22 and 24 attach module 20 to a heat transfer surface (not shown) provided in or on an entity such as a cabinet 70 which is in thermal communication with a fluid medium (e.g., air or water), items or components within the cabinet. For example, if cabinet 70 is a computer cabinet in which are provided microprocessors to be cooled, the microprocessors themselves being mounted on a heat sink (not shown) fixed to the interior wall of the cabinet, the heat sink may be placed in conductive communication with cold plate 24 of module 20 and thereby cooled. Similarly, a finned heat exchanger (not shown) located within cabinet 70, and over or through which the fluid medium is flowed, may be placed in conductive communication with cold plate 22 or 24 of module 20 to effect heating or cooling of the enclosure. The applications for which module 20 may be utilized for heating or cooling vary greatly, and the means for interfacing with the heat transfer surface of module cold plate 22 or 24, which is to be determined and provided by the above-mentioned manufacturer or its customer, may similarly vary greatly.

Notably, a module 20 may be employed for either heating or cooling purposes by merely reversing its orientation relative to the enclosure, and placing heating plate 22 or cooling plate 24 in communication therewith. When attached to cabinet 70, module 20 may be supported as necessary by means of, for example, support structure 72. As will now be apparent a plurality of modules 20 may be connected to an enclosure, each perhaps heating or cooling different groups of components or items, or perhaps providing different heat transfer sites for a fluid medium, or different fluid mediums, within the enclosure. A plurality of modules 20 interfacing with an enclosure at different locations may be said to be connected in parallel relative to the enclosure, as can be readily envisioned by one of ordinary skill in the art. Each module of this plurality may be, if desired, independently powered and operated, and may provide any necessary redundancy required by the application.

Figure 4:
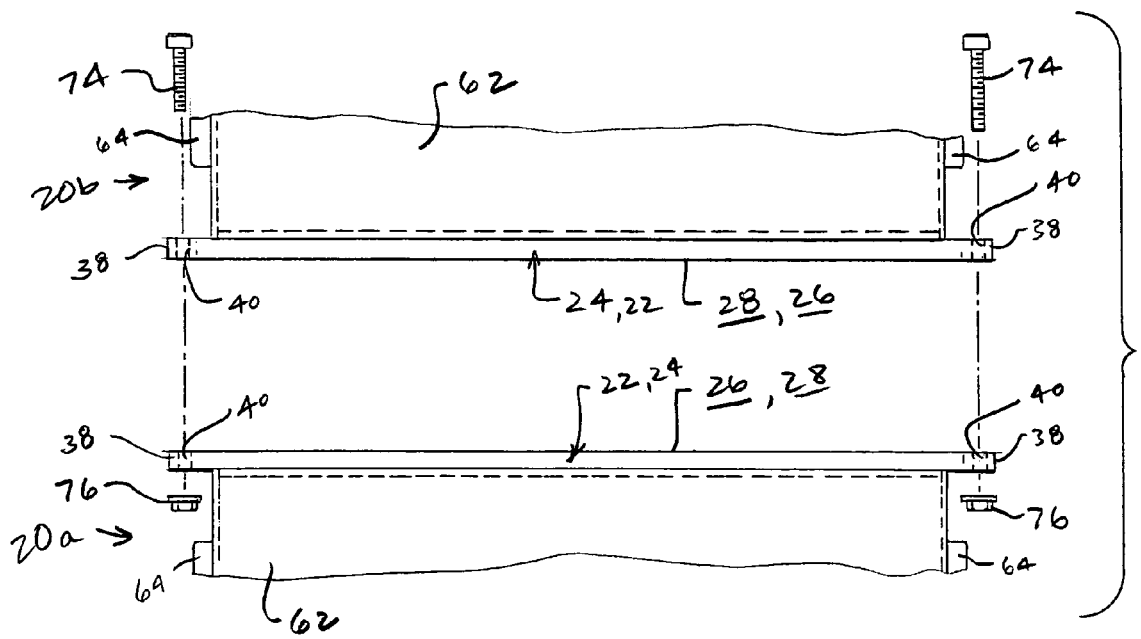
FIG. 4 is an exploded, fragmentary, top plan view of first and second modules as depicted in FIG. 1, which are series-connected.

Referring now to FIG. 4, it can be seen that a plurality of modules 20 may also be connected in series such that the interfacing heat transfer surfaces 26, 28 of adjacent heating and cooling plates 22, 24 are brought into conductive contact, the two modules affixed to each other by means of bolts 74 extending through aligned bolt holes 40 and nuts 76. So connected, the heating or cooling plate, 22 or 24, of module 20a is respectively abutted to the cooling or heating plate, 24 or 22, of adjacent module 20b, which may be identical. The one of modules 20a and 20b which is directly connected to the enclosure serves as the primary module of its heating or cooling system, the other module(s) in series connection with the primary module serving to increase the system's capacity. Each module in the series-connected chain of modules may be, if desired, independently powered and operated. Notably, a conductive gel of any known type may be spread on one or both of abutting surfaces 26 and 28 to ensure good conductive heat transfer therebetween.

Figure 5:
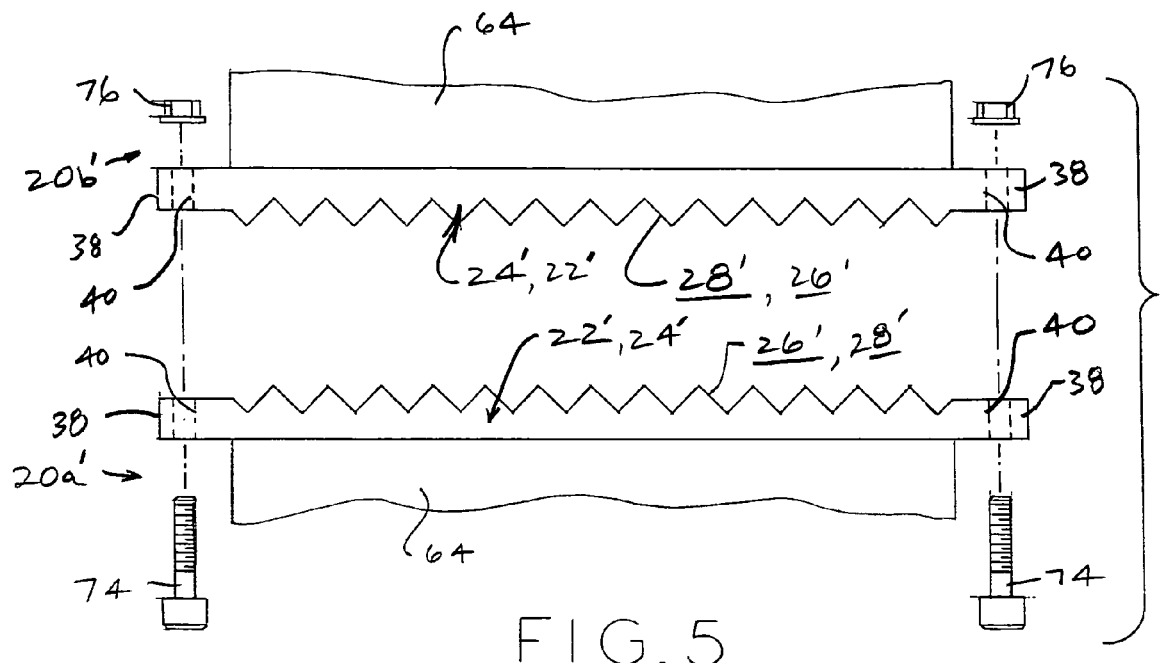
FIG. 5 is an exploded, fragmentary, top plan view of first and second modules according to a second embodiment of the present invention, which are series connected.

Referring now to FIG. 5, a series-connected pair of second embodiment modules 20a' and 20b' is shown. Modules 20a', 20b' are substantially identical in structure and function to modules 20a, 20b (FIG. 4), but are provided with cold plates 22', 24' having heat transfer surfaces 26', 28' which are sawtoothed and therefore of greater area. Surfaces 26', 28' are interfittingly abutted such that the peaks of one surface are received in the valleys of the other surface, and thus a greater conductive heat transfer may be obtained. As discussed above with reference to FIG. 4, modules 20a' and 20b' are identical, and are connected together by means of bolts 74 and nuts 76. Preferably, the heat transfer surface provided by the enclosure, which would interface with the primary module's heat transfer surface 26' or 28', would be similarly sawtoothed.

Figure 6:
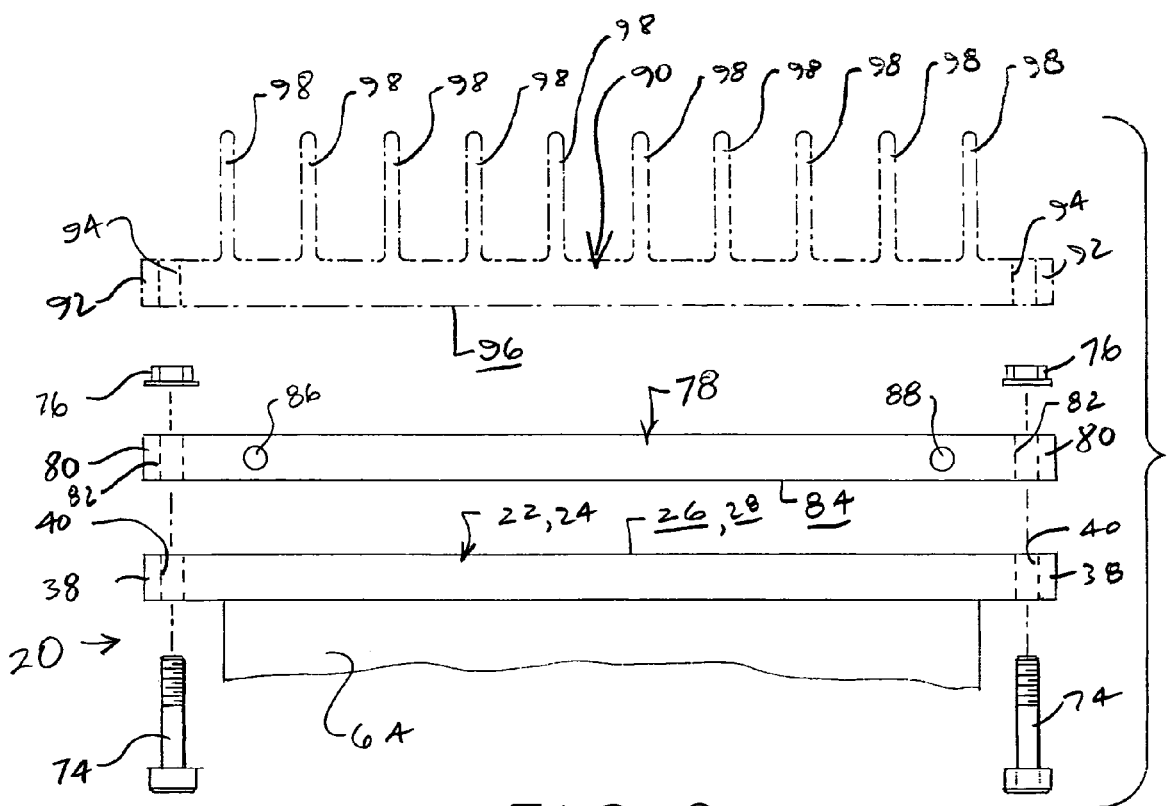
FIG. 6 is an exploded, fragmentary, top plan view of a first embodiment module which is series-connected to a liquid-cooled cold plate or, alternatively, a convective heat transfer plate.

The module heating or cooling plate which is most distant from the system's interface with the enclosure being cooled or heated, respectively, may itself be cooled or heated, as the case may be, by any of a number of means. Referring now to FIG. 6, to this cold plate 22 or 24 may be placed in thermal communication with cold plate 78, through which a cooling or heating fluid such as, respectively, cold or warm water, is circulated for providing or removing heat to or from the interfacing module cold plate, as necessary. Water at room temperature may adequately serve both cooling and heating purposes. Thus, cold plate 78 serves as a heatsink to which heat removed from the cooled enclosure, or as a heat source from which heat may be provided to a heated enclosure, and may be optionally provided as the application may warrant.

Optional cold plate 78, which has edges provided with laterally outwardly extending tabs 80 having clearance holes 82 which are aligned with holes 40 tabs 38, is affixed to module 20 by bolts 74 and nuts 76. The interfacing heat transfer surfaces of the module and cold plate 78 are in conductive contact, perhaps through a conductive gel, and are preferably of matching areas. Cold plate 78 is provided with inlet 86 and outlet 88 through which water respectively is supplied thereto and exits therefrom.

In lieu of cold plate 78, FIG. 6 shows that, alternatively, convective heat exchange plate 90 (FIG. 6) may be similarly attached to cold plate 22 or 24 of module 20. Heat exchange plate 90 may be, for example, an aluminum casting or machining. As shown, the edges of convective heat exchange plate 90 are provided with laterally outwardly extending tabs 92 each provided with a bolt hole 94 which is aligned with a bolt hole 40, convective heat exchange plate 90 being mounted to module 20 and secured thereto with bolts 74 and nuts 76, with heat transfer surfaces 96 and 26 or 28 in conductive contact. These interfacing surfaces are preferably of matching areas and may be sawtoothed as described above. Heat exchange plate 90 is provided with a plurality of vertically extending fins 98 for promoting heat transfer from cooling plate 90 to the ambient air via natural or forced convection.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. In combination:

a first refrigeration system module for heating or cooling an object, said first module comprising:

an enclosure having a refrigeration system disposed therein, said refrigeration system including a vapor compression circuit for circulating a refrigerant and having a compressor, a first heat exchanger, an expansion device and a second heat exchanger operably disposed therein in serial order;

said first heat exchanger defining a first outward facing surface of said enclosure, said first surface being a thermal exchange surface wherein said first heat exchanger provides thermal communication between said first surface and refrigerant flowing within said first heat exchanger; said second heat exchanger defining a second outward facing surface of said enclosure; said second surface being a thermal exchange surface wherein said second heat exchanger provides thermal communication between said second surface and refrigerant flowing within said second heat exchanger, said first and second surfaces being disposed on opposite sides of said enclosure and having substantially similar surface areas;

at least one attachment feature disposed on said module wherein said at least one attachment feature is attached to the object to thereby secure the object in thermal communication with at least one of said first and second surfaces; and a second module wherein said at least one attachment features of said first and second modules are secured together and said first surface of one of said first and second modules is in thermal communication with said second surface of the other of said first and second modules.

2. In combination:

a first refrigeration system module for heating or cooling an object, said first module comprising:

an enclosure having a refrigeration system disposed therein, said refrigeration system including a vapor compression circuit for circulating a refrigerant and having a compressor, a first heat exchanger, an expansion device and a second heat exchanger operably disposed therein in serial order;

said first heat exchanger defining a first outward facing surface of said enclosure, said first surface being a thermal exchange surface wherein said first heat exchanger provides thermal communication between said first surface and refrigerant flowing within said first heat exchanger; said second heat exchanger defining a second outward facing surface of said enclosure; said second surface being a thermal exchange surface wherein said second heat exchanger provides thermal communication between said second surface and refrigerant flowing within said second heat exchanger, said first and second surfaces being disposed on opposite sides of said enclosure and having substantially similar surface areas;

at least one attachment feature disposed on said module wherein said at least one attachment feature is attached to the object to thereby secure the object in thermal communication with at least one of said first and second surfaces; and a second module wherein said at least one attachment features of said first and second modules are secured together and said attachment features comprise a plurality of apertures disposed adjacent each of said first and second surfaces of each of said first and second modules and said first surface of one of said first and second modules is in thermal communication with said second surface of the other of said first and second modules.

3. A modular refrigeration system comprising:

a plurality of refrigeration system modules, each of said modules comprising: an enclosure having a refrigeration system disposed therein, said refrigeration system including a vapor compression circuit for circulating a refrigerant and having a compressor, a first heat exchanger, an expansion device and a second heat exchanger operably disposed therein in serial order;

said first heat exchanger defining a first outward facing surface of said enclosure, said first surface being a thermal exchange surface wherein said first heat exchanger provides thermal communication between said first surface and refrigerant flowing within said first heat exchanger; said second heat exchanger defining a second outward facing surface of said enclosure; said second surface being a thermal exchange surface wherein said second heat exchanger provides thermal communication between said second surface and refrigerant flowing within said second heat exchanger, said first and second surfaces being disposed on opposite sides of said enclosure; and at least one attachment feature disposed on said module wherein said at least one attachment feature is attachable to another one of said modules to thereby secure the first surface of one of said plurality of modules in thermal communication with the second surface of another one of said plurality of modules.

4. The modular refrigeration system of claim 3 wherein for each of said modules said at least one attachment feature comprises a plurality of apertures disposed adjacent each of said first and second surfaces.

5. The modular refrigeration system of claim 3 wherein for each of said modules said compressor is a hermetically sealed compressor mounted within said enclosure and said enclosure provides communication between an interior of the enclosure and the ambient environment.

6. In combination:

a first refrigeration system module, comprising:

a frame;

a heating plate having a fluid inlet and a fluid outlet and a first heat transfer surface;

a cooling plate having a fluid inlet and a fluid outlet and a second heat transfer surface;

an expansion device disposed between said heating and cooling plates and in fluid communication with said heating plate fluid outlet and said cooling plate fluid inlet; and a hermetic compressor assembly comprising a housing, an electric motor and a compression mechanism, said compression mechanism being driven by said motor, said compressor assembly disposed between said heating and cooling plates and having a discharge outlet in fluid communication with said heating plate fluid inlet, and a suction inlet in fluid communication with said cooling plate fluid outlet;

wherein said heating plate, said cooling plate, said expansion device and said compressor assembly are fixed to said frame, and said first and second heat transfer surfaces each at least partially define an exterior surface of said module; and a second said module connected to said first module, said first heat transfer surface of one of said first and second modules being in conductive communication with said second heat transfer surface of the other of said first and second modules.

7. In combination:

a first refrigeration system module, comprising:

a frame;

a heating plate having a fluid inlet and a fluid outlet and a first heat transfer surface;

a cooling plate having a fluid inlet and a fluid outlet and a second heat transfer surface;

an expansion device disposed between said heating and cooling plates and in fluid communication with said heating plate fluid outlet and said cooling plate fluid inlet; and a hermetic compressor assembly comprising a housing, an electric motor and a compression mechanism, said compression mechanism being driven by said motor, said compressor assembly disposed between said heating and cooling plates and having a discharge outlet in fluid communication with said heating plate fluid inlet, and a suction inlet in fluid communication with said cooling plate fluid outlet;

wherein said heating plate, said cooling plate, said expansion device and said compressor assembly are fixed to said frame, and said first and second heat transfer surfaces each at least partially define an exterior surface of said module; and a second said module connected to said first module, said first heat transfer surface of one of said first and second modules being in conductive communication with said second heat transfer surface of the other of said first and second modules, wherein said first heat transfer surface of one of said first and second modules and said second heat transfer surface of the other of said first and second modules are non-planar mating surfaces.

8. A modular refrigeration system, comprising a plurality of refrigeration system modules, each said module including:
- a heating plate having a fluid inlet arid a fluid outlet and a first heat transfer surface;
- a cooling plate having a fluid inlet and a fluid outlet and a second heat transfer surface, said first and second heat transfer surfaces each at least partially defining an exterior surface of said module;
- an expansion device disposed between said heating and cooling plates and in fluid communication with said heating plate fluid outlet and said cooling plate fluid inlet; and
- a compressor assembly disposed between said heating and cooling plates and having a discharge outlet in fluid communication with said heating plate fluid inlet, and a suction inlet in fluid communication with said cooling plate fluid outlet;
- wherein said plurality of refrigeration system modules are configured to be connected to each other in series.

9. The system of claim 8, wherein said first heat, transfer surfaces are configured to be in conductive communication with said second heat transfer surfaces of other said modules when said modules are connected to each other in series.

10. The system of claim 9, wherein said first heat transfer surfaces and said second heat transfer surfaces are non-planar surfaces wherein peaks of one surface are received in valleys of the other surface.

11. The system of claim 8, wherein said plurality of refrigeration system modules are configured to be bolted together.

12. The system of claim 8, wherein each said module further includes a frame, and wherein said heating plate, said cooling plate, said expansion device and said compressor assembly are fixed to said frame.

13. The system of claim 8, wherein each said compressor assembly includes a housing, an electric motor, and a compression mechanism, said compression mechanism being driven by said motor.

14. The system of claim 8, wherein each said compressor assembly is hermetic.

15. A refrigeration system, comprising:
- first and second modules, each of said first and second modules having a heating plate, a cooling plate, an expansion device, and a compressor assembly;
- each said heating plate having a fluid inlet and a fluid outlet and a first heat transfer surface;
- each said cooling plate having a fluid inlet and a fluid outlet and a second heat transfer surface;
- each said expansion device disposed between respective said heating and cooling plates and in fluid communication with the respective heating plate fluid outlet and the respective cooling plate fluid inlet; and
- each said compressor assembly disposed between respective said heating and cooling plates and having a discharge outlet in fluid communication with the respective heating plate fluid inlet, and a suction inlet in fluid communication with the respective cooling plate fluid outlet;
- wherein said first and second heat transfer surfaces each at least partially define an exterior surface of the respective said module; and
- said first heat transfer surface of one of said first and second modules being in conductive communication with said second heat transfer surface of the other of said first and second modules.

16. The combination of claim 15, wherein said first heat transfer surface of one of said first and second modules and said second heat transfer surface of the other of said first and second modules are sawtoothed.

17. The combination of claim 15, wherein said first heat transfer surface of one of said first and second modules and said second heat transfer surface of the other of said first and second modules are of matching areas.

18. The system of claim 15, wherein each said module further includes a frame, and wherein the respective heating plate, the respective cooling plate, the respective expansion device and the respective compressor assembly are fixed to said frame.

19. The system of claim 15, wherein said compressor assembly includes a housing, an electric motor, and a compression mechanism, said compression mechanism being driven by said motor.

20. The system of claim 15, wherein said compressor assembly is hermetic.

\* \* \* \* \*

UNITED STATES PATENT AND TRADEMARK OFFICE
CERTIFICATE OF CORRECTION

PATENT NO. : 7,401,472 B2  
APPLICATION NO. : 10/750693  
DATED : July 22, 2008  
INVENTOR(S) : Dan M. Manole Page 1 of 1

It is certified that error appears in the above-identified patent and that said Letters Patent is hereby corrected as shown below:

Claim 8, Column 11, Line 9, delete "arid" and insert --and--

Signed and Sealed this

Twenty-third Day of September, 2008

JON W. DUDAS  
*Director of the United States Patent and Trademark Office*